United States Patent [19]
Lopez et al.

[11] Patent Number: 5,344,332
[45] Date of Patent: Sep. 6, 1994

[54] APPARATUS AND METHOD FOR FLOATABLE ELECTRICAL CONNECTION OF SEMI-RIGIDLY MOUNTED DEVICES

[75] Inventors: Roger A. Lopez, Louisville; Robert J. Miosek, Berthoud; Robert Walsh, Boulder, all of Colo.

[73] Assignee: Storage Technology Corporation, Louisville, Colo.

[21] Appl. No.: 71,682

[22] Filed: Jun. 3, 1993

[51] Int. Cl.$^5$ .............................. H01R 13/74
[52] U.S. Cl. ........................ 439/248; 29/854
[58] Field of Search ............ 439/297, 298; 29/854

[56] References Cited
U.S. PATENT DOCUMENTS
5,071,374 12/1991 Plocek et al. ................. 439/297 X

*Primary Examiner*—Eugene F. Desmond
*Attorney, Agent, or Firm*—Duft, Graziano & Forest

[57] ABSTRACT

A method and apparatus for mounting mated floating, electrical connectors is disclosed. Floating connectors are used to isolate the component parts of the connectors from the vibrations of devices which are semi-rigidly mounted with respect to one another and to which the connectors are movably mounted. The floating connector of the present invention provides a high degree of freedom to float both side to side and up and down. The connector has flanges extending over the walls of an opening into which the connector is movably mounted. This allows the connector a wide range of freedom to float. Both a snap-in and a twist-in connector design are shown. A flexible wiring circuit attached to the floating connector provides both electrical connections to an associated device as well as a spring bias tension to further retain the connector within the receptacle. Obscured (often called "blind") connections are simplified by the connector because the high degree of float permits a wide range of misalignment as the floating connector mates with another connector. This easy to assemble connector apparatus allows for inexpensive, reliable, floating, blind connections between devices.

11 Claims, 3 Drawing Sheets

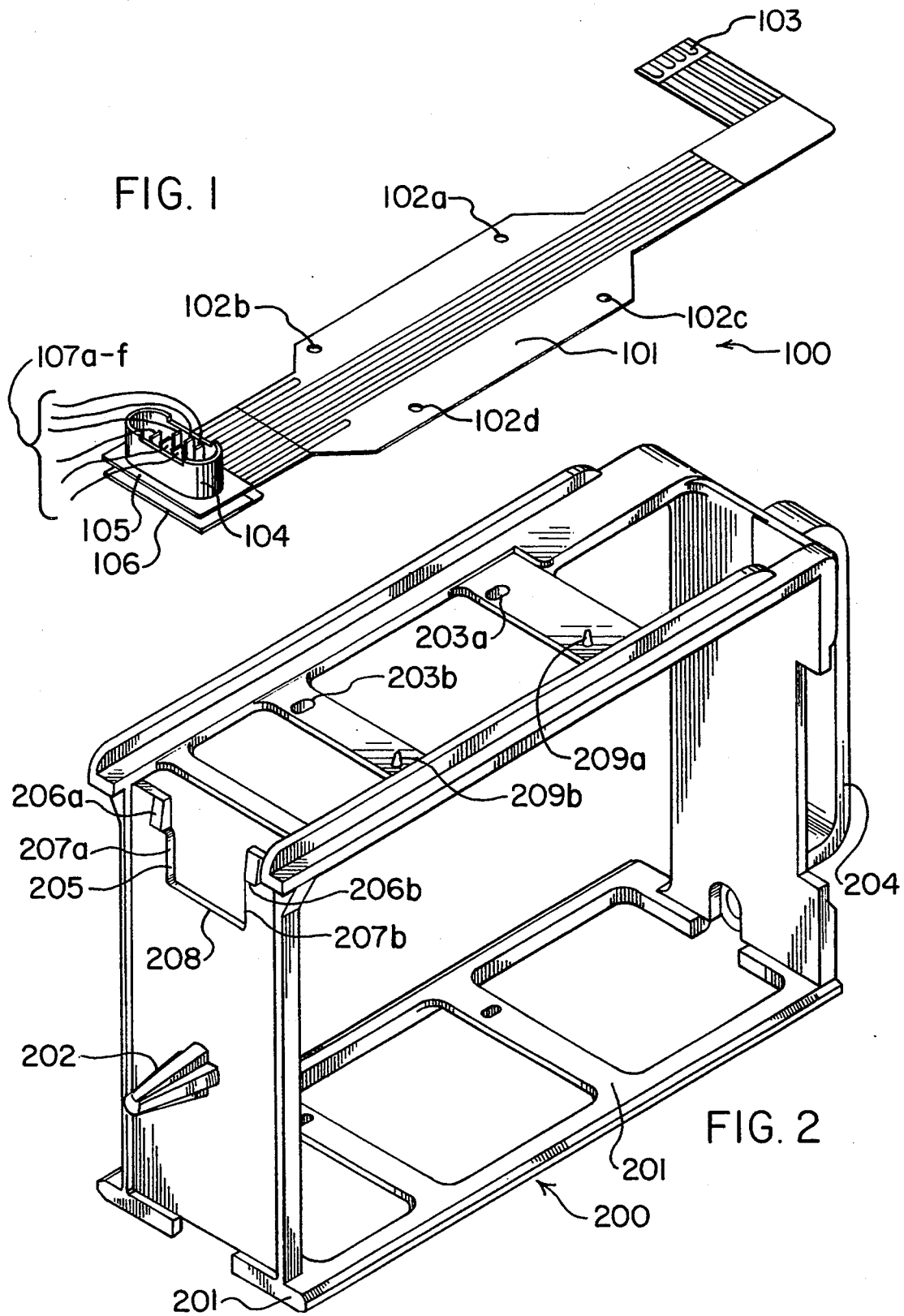

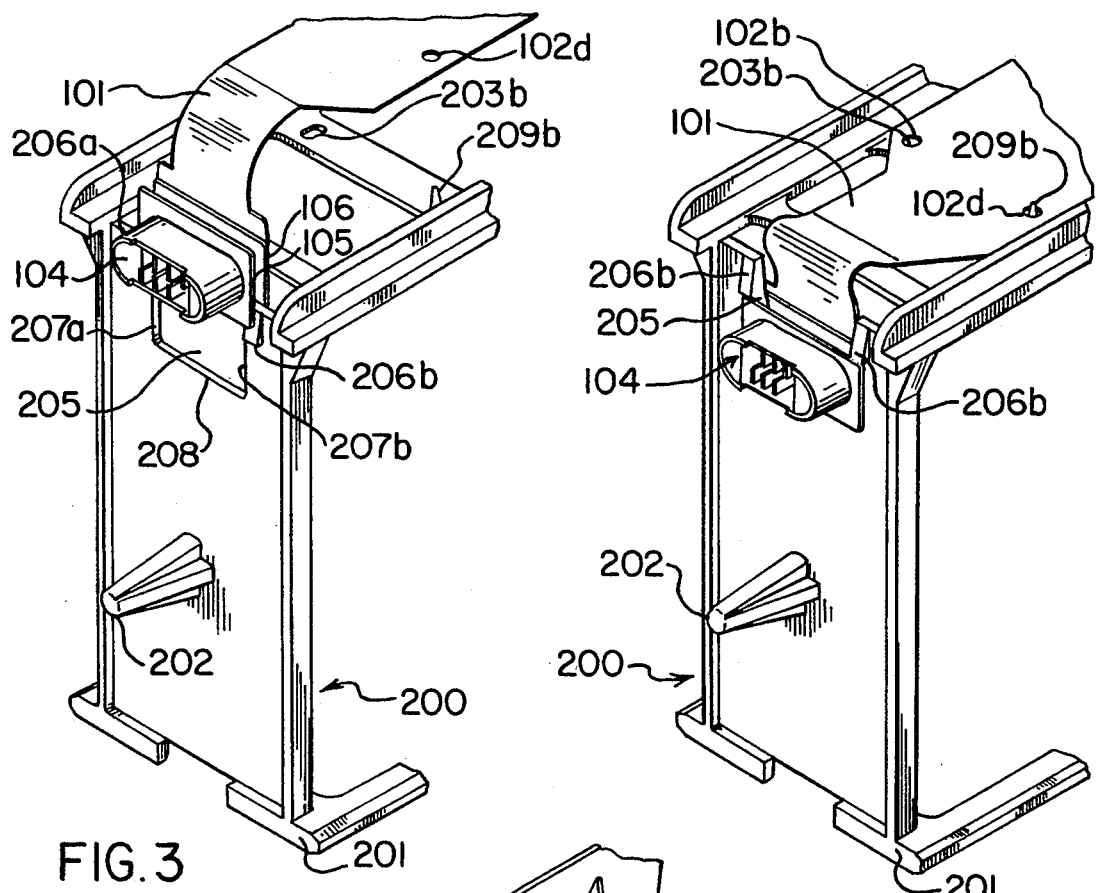
FIG. 3
FIG. 4
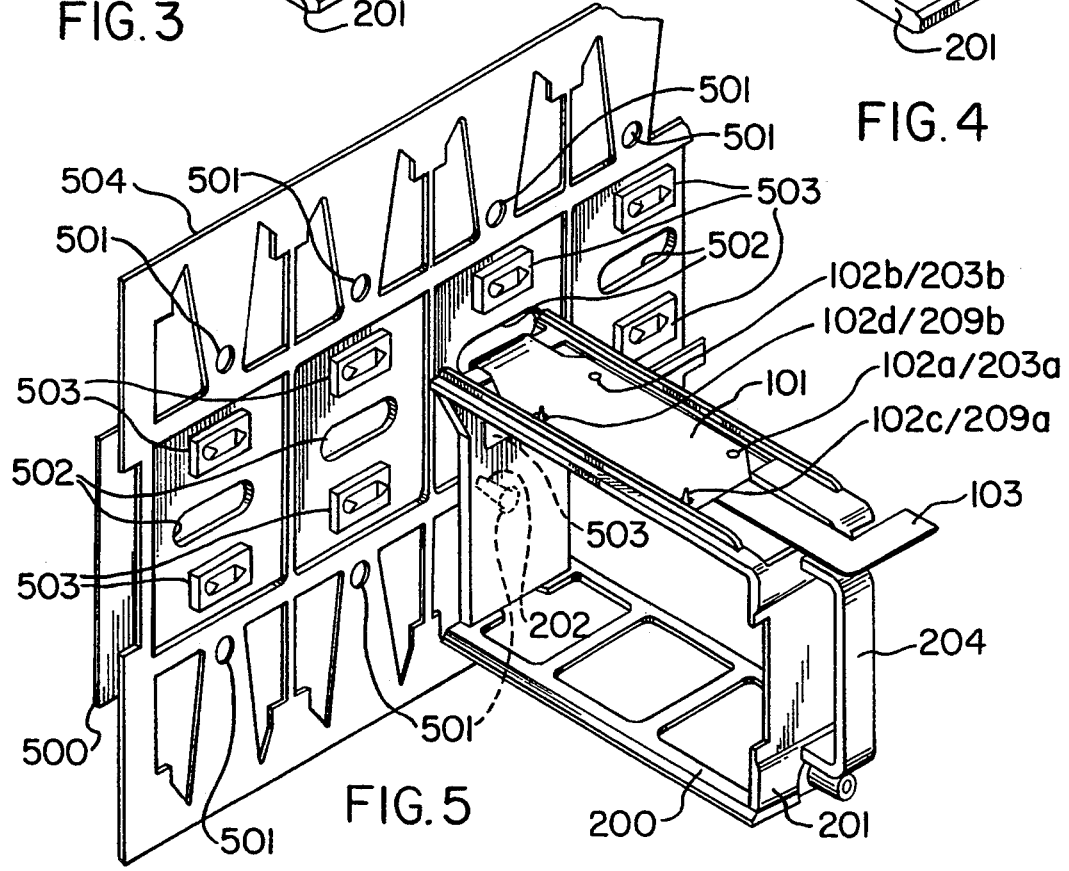
FIG. 5

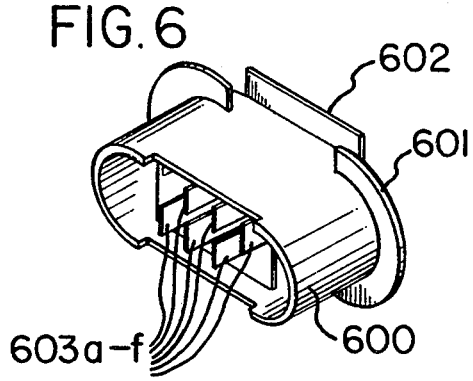
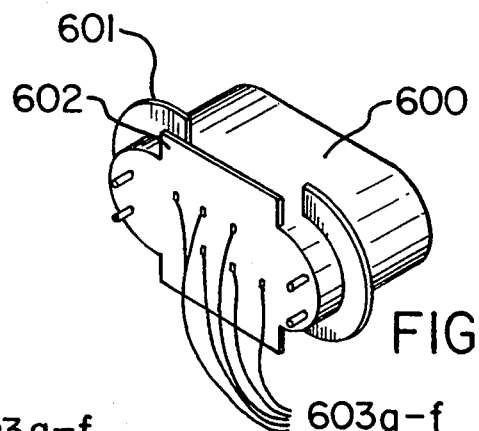
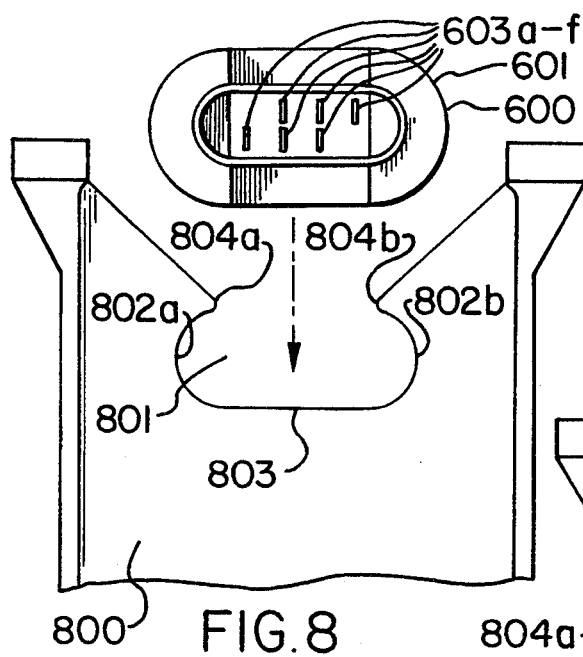
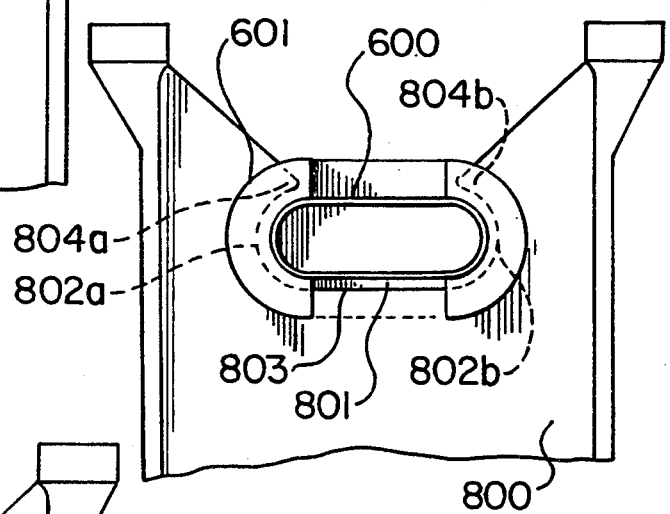
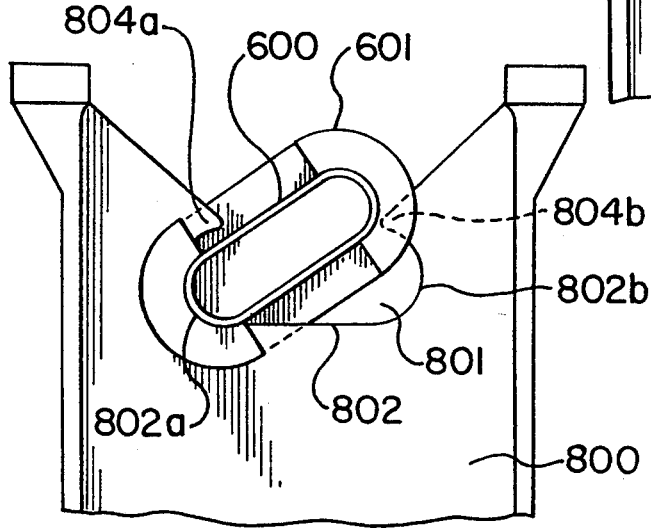

APPARATUS AND METHOD FOR FLOATABLE ELECTRICAL CONNECTION OF SEMI-RIGIDLY MOUNTED DEVICES

RELATED APPLICATIONS

This application relates to co-pending application Ser. No. 547,697, filed on Jul. 2, 1990, by Steven Dale Bock, et al., allowed on Nov. 6, 1992, now U.S. Pat. No. 5,212,681, issued May 18, 1993.

FIELD OF THE INVENTION

The present invention relates to the electrical interconnection of devices which are semi-rigidly mounted with respect to one another. More specifically, the invention relates to a method and apparatus for providing vibration isolation and electrical connection of electronic devices that are semi-rigidly mounted with respect to one another.

STATEMENT OF THE PROBLEM

It is commonplace to mount a plurality of vibration-sensitive electronic devices onto a common plane, frame, chassis, or platform where the plurality of devices together can communicate with one another to perform a subsystem or system function. These plurality of vibration-sensitive devices must be mechanically isolated from one another insofar as vibration is concerned so as to preclude the vibration of one device from deleteriously affecting the operation of another. Semi-rigid mounts are typically used in the mounting of these devices in order to prevent such mechanical vibrations and deleterious interactions. The electrical interconnection of two or more of these devices is achieved by the use of suitable interconnecting means such as mating electrical connectors, i.e., plugs and sockets. Flexibility must be provided in the electrical interconnection since it is not desirable to directly connect a plug that is rigidly mounted on a first device to a socket that is rigidly mounted on a second device. The reason for this is that the mechanical vibrations of the two devices interconnected in such a manner will unduly stress the elements of the mated connectors and ultimately cause their failure and destruction. In many applications there is the added disadvantage that the mated connectors mounted on the respective devices are visually or otherwise obscured from view when the two devices are positioned with respect to each other to achieve a mating of the connectors. This visual obstruction makes more difficult the process of electrically interconnecting the directly mounted connectors of the two devices. These obscured connections are typically referred to as "blind" matings. Blind matings are time consuming to assemble and increase the cost of the system or subsystems of which the interconnected devices are a part.

It is known to avoid the problem of directly mounted mated connectors, by using a flexible electrical connection means such as, for example, flexible cable harnesses or ribbon connectors which extend between the devices to be connected. The cable harnesses or ribbon cables are connected at each of their ends via mating connectors to the devices that are to be interconnected.

The cable harness successfully isolates the electrical connectors from the vibrations of the devices. However, the cable harness connectors often must be separately positioned in the assembly process to mate with opposite gender connectors. This is an assembly step distinct from positioning the device itself. In addition, the loose cable harness must be folded and stored so as to not interfere with the neighboring mounted devices. Also, this cable harness solution does not easily permit blind matings between devices due to the complexities of the assembly process.

It is known to use directly mounted "floating connectors" between two semi-rigidly attached devices. A connector is said to "float" when it has some freedom to shift position but remains physically attached to its device. However, the known designs offered only a small range of float because of the use of rubber grommets and the like surrounding the floating connector. This small range of float requires precision in the manufacture of the various components and in the assembly of the final product. With such limited float, the positioning of the connectors for proper mating is a critical factor in the product manufacture and assembly. Blind connections are possible, but they are also limited by the small degree of float allowed.

All known prior connection methods have used relatively expensive parts for assembling various components of the mating devices. Screws, nuts, washers, grommets, and rivets are relatively expensive elements in the electrical connections of semi-rigidly mated devices. The labor costs of assembling such connections tends to be a significant factor as well due to the relative complexity of the design.

SOLUTION

The present invention overcomes these problems and achieves an advance in the art by providing a cost effective, easily assembled, floating, blind electronic interconnection between semi-rigidly mounted devices. The present invention permits a first device, such as a common electronic motherboard, to be semi-rigidly attached to one or more other devices that vibrate as they are operated. The semi-rigid physical mounting of the devices prevents the vibration of one device from damaging another device or the motherboard itself.

The present invention permits the first device, such as a motherboard, having a directly mounted connector, to be connected electrically to a floating connector of a second device. The floating connector of the second device permits the motherboard and the second device to vibrate with respect to each other without damaging the components comprising the connector on either the motherboard or the other device.

Two described embodiments of the invention are disclosed regarding how a floating connector is inserted into position in a receptacle formed in the frame of a device. In one embodiment, the floating connector is inserted in a device frame with a twisting motion. In the other embodiment, the floating connector is slid into position in the device frame. The device frame is adapted to receive an electronic device that is to be electrically connected to the motherboard. The floating connector on the device frame mates to a connector of the opposite gender rigidly positioned on the motherboard. There is no requirement for the use of expensive mechanical elements (such as screws, nuts or washers) nor for extensive labor in the assembly process.

The degree of float of a connector is determined by the clearance between the body of the floating connector and the surrounding material of the device frame to which it is movably mounted. This clearance is a non-critical dimension in the present invention and serves to reduce the cost of manufacturing both in terms of component cost and manufacturing yield. Flanges on the front and back side of the floating connector retain the floating connector within the confines of the surrounding walls of an opening in the device frame. However, the flanges still permit the significant freedom for the connector to float in two dimensions within that area.

A flexible wiring circuit is provided to electrically connect the floating connector on the device frame to the electronic device housed within the device frame. This flexible circuit is affixed to the side of the device frame and one of its ends is turned ninety degrees around a corner of the device frame where it attaches to the floating connector mounted within the device frame. Flex in the wiring circuit provides a spring bias on the floating connector to help retain the connector within the confines of its opening in the device frame.

In both embodiments, the increased float permitted by the connectors protects the elements of the floating connectors from the damage that would otherwise be caused by the physical vibration of the electronic devices mounted to the device frame. This float dramatically reduces fatigue of the electrical connectors to provide enhanced reliability. The increased float of the connector also provides for easier self-alignment of the mating connectors on the motherboard. As the device frame is moved into mounting position to engage a connector on the motherboard, the floating electrical connector is permitted to shift to a great degree to align with the mating connector on the motherboard. This ability permits easier blind mating assembly and eliminates the need to separately position and connect the electrical mating connectors.

BRIEF DESCRIPTION OF THE DRAWINGS

FIG. 1 shows a flexible wiring circuit having a floating connector attached to one end;

FIG. 2 shows one possible exemplary embodiment of a device frame which can semi-rigidly mount to an electronic motherboard and which can house a device to be electrically connected to the motherboard;

FIG. 3 shows the floating connector of FIG. 1 ready to be snapped into a device frame;

FIG. 4 shows the floating connector of FIG. 1 snapped into position in a device frame;

FIG. 5 shows the device frame of FIG. 2 semi-rigidly mounted to a housing and a motherboard which is capable of mounting several similar device frames;

FIG. 6 is an isometric view of the mating side of an alternative floating twist-in connector;

FIG. 7 is an isometric view of the back side of the floating twist-in connector of FIG. 6;

FIG. 8 shows the twist-in connector of FIG. 6 ready to be assembled into a device frame;

FIG. 9 shows the twist-in connector of FIG. 6 partly twisted into position in a device frame; and FIG. 10 shows the twist-in connector of FIG. 6 fully twisted into position in a device frame.

DETAILED DESCRIPTION

One possible exemplary embodiment of the present invention is depicted in FIGS. 1-4. FIG. 1 shows a flexible wiring circuit 100 with a floating snap-in connector 104 attached to its left end. This wiring circuit is adapted to be affixed to device frame 200 shown in FIG. 2. Flexible wiring assembly 101 is bent downward ninety degrees, as shown in FIG. 3, to align connector 104 with its receptacle 205 in device frame 200. The snap-in connector 104 of FIG. 3 slides into a snap-in receptacle 205 of device frame 200. Receptacle 205 (FIG. 2) is formed by side edges 207a and 207b and bottom edge 208. Side edges 207a and 207b and bottom edge 208 slide between front flange 105 and the rear flange 106 of connector 104. Flanges 105 and 106 are flexible to allow the snap-in connector 104 to slide over the thickened and tapered receptacle retaining ridges 206a and 206b. The taper of ridges 206a and 206b spreads flanges 105 and 106 to widen the gap between the flanges as the connector is inserted into receptacle 205 (FIG. 3). As shown in FIG. 4, flanges 105 and 106 flex back to their normal position after snap-in connector 104 slides into receptacle far enough for the top edges of flanges 105 and 106 to clear the tapered receptacle retaining ridges 206a and 206b. The tapered ridges 206a and 206b thereby serve to retain snap-in connector 104 in its floating position inside the snap-in receptacle 205.

As shown in FIG. 1, snap-in connector 104 is attached physically and electrically to one end of a flexible wire assembly 101 by means of the connector pins 107a–f. The other end of the flexible wire assembly 101 provides for an electrical connection 103 to a device (not shown) housed within device frame 200 of FIG. 2. Positioning holes 102c and 102d of flexible wiring assembly 101 of FIG. 1 are adapted to slide over corresponding positioning pins 209a and 209b of FIG. 2 on device frame 200. Screws (not shown) are inserted through positioning holes 102a and 102b and through corresponding screw holes 203a and 203b to secure the position of flexible wiring circuit 101 on device frame 200.

FIG. 3 shows snap-in connector 104 and the left end of flexible wiring assembly 101 bent downwards ninety degrees. This permits snap-in connector 104 to be slid into snap-in receptacle 205. When both snap-in connector 104 and flexible wiring assembly 101 are in their installed position of FIG. 4, the upward flex in the left end of flexible wiring assembly 101 provides a downward spring tension on snap-in connector 104 within the snap-in receptacle 205. This bias tension serves as an additional means to retain connector 104 within receptacle 205 as shown in FIG. 4.

FIG. 3 depicts snap-in connector 104 positioned above receptacle 205 of device frame 200 ready to slide over the receptacle retaining ridges 206a and 206b. FIG. 4 depicts the snap-in connector 104 slid down over the tapered receptacle retaining ridges 206a and 206b in its floating position within receptacle 205.

As depicted in FIGS. 1–4, connector flanges 105 and 106 are wider than the distance between the receptacle side edges 207a and 207b of snap-in receptacle 205. The width of the main body of snap-in connector 104 is smaller than the distance between the receptacle side edges 207a and 207b. Connector flanges 105 and 106 are shorter in height than the distance from the receptacle bottom edge 208 to the receptacle tapered retaining ridge 206a and 206b. These dimensions of flanges 105 and 106 relative to the body of snap-in connector 104 and the snap-in receptacle 205 determine the degree of side to side float of the snap-in connector 104 as well as up and down float within the snap-in receptacle 205. A higher degree of float enables better self-alignment characteristics for the mating of snap-in connector 104 with its opposing motherboard mating connector 503 shown in FIG. 5. It also permits better isolation of the electrical connection from vibration emanating from an electronic device (not shown) housed in its device frame 200 or other neighboring devices.

Device frame 200 is adapted to be semi-rigidly mounted to an electronic motherboard 500 as shown in FIG. 5. The semi-rigid mounting of device frame 200 to motherboard 500 reduces the transmission of mechanical vibration from an electronic device (not shown) housed in a device frame 200 through the motherboard 500 to other electronic devices in other device frames 200 (not shown). Connector 104 (not shown in FIG. 5) connects to a corresponding mating connector 503 rigidly attached to motherboard 500. As shown in FIG. 4, connector 104 floats within receptacle 205 of its device frame 200 to isolate itself from the vibration of the electronic device (not shown) housed within its device frame 200. This reduces fatigue of the electrical connectors and improves connector life and reliability.

FIG. 5 depicts how device frame 200 is adapted to be semi-rigidly mounted to an electronics motherboard 500. Each of several such device frames 200 may contain a device (not shown) which is electronically connected to motherboard 500 through use of the floating connectors and wiring assembly 101 of the present invention. A device frame stabilizer pin 202 (FIG. 2) of device frame 200 slides into a stabilizer grommet 501 in the device housing 504 as shown in FIG. 5. Stabilizer pin 202 is cushioned by grommet 501 so as to reduce the transmission of vibrations to motherboard 500 from the operating device (not shown) mounted on frame 200. Flexible wiring circuit 101 is attached to the top side of frame 200 and connects floating connector 104 (not shown in FIG. 5) to a device (not shown) housed within device frame 200. Floating snap-in connector 104 (not shown in FIG. 5) plugs into a mating connector 503 of FIG. 5 which is rigidly attached to motherboard 500. Floating snap-in connector 104 (not shown in FIG. 5) isolates the mated connectors from the vibrations of the device (not shown) mounted to device frame 200.

The tapered shape of device frame stabilizer pin 202 shown in FIG. 2 and the high degree of float of snap-in connector 104 within snap-in receptacle 205 (FIG. 4), simplify blind connection of mated electrical connections between device frame 200 and motherboard 500. As shown in FIG. 5, tapered stabilizer pin 202 mates with stabilizer grommet 501 which serves to position device frame 200 as it is slid in toward the motherboard 500 and housing 504. The high degree of float allowed by the snap-in connector 104 and receptacle 205 (FIG. 4) allows for a wide latitude in misalignment with the mating connector 503 of motherboard 500 of FIG. 5. Stabilizer grommets 501 of FIG. 5 isolate devices (not shown) in other device frames 200 from vibrations transmitted through common motherboard 500. These floating electrical connections protect the components of connectors 104 and 503 from fatigue due to device vibrations.

U.S. Pat. No. 5,212,681, by Steven Dale Book, et al., provides further detail regarding the mechanical relationship of device frame 200 to motherboard 500 and housing 504 as depicted in FIG. 5. The "Disk Drive Positioning and Interlock Apparatus" disclosed therein shows a disk drive cartridge (device frame), inserted and supported by a disk drive housing (housing), and electrically connected to a backplane wiring (motherboard). The apparatus of the Book patent encompasses the mechanical aspects of the semi-rigid mounting of devices with respect to one another. The floating electrical connection apparatus disclosed in the present invention may be advantageously applied in the context of the apparatus of the Book patent as well as other similar environments.

FIGS. 6–10 illustrate another exemplary embodiment of the floating connector of the present invention. This alternative embodiment is similar to the first exemplary embodiment of FIGS. 1–5. Twist-in connector 600 of FIG. 6 is similar to snap-in connector 104 of FIG. 1 and comprises a front flange 601, a rear flange 602, and electrical pins 603a–f. Twist-in connector 600, like snap-in connector 104 in FIG. 1, is adopted to be attached to a flexible wiring circuit (not shown) similar to 100 of FIG. 1. Twist-in receptacle 801 of device frame 800 of FIG. 8 is similar to snap-in receptacle 205 in device frame 200 of FIG. 2. Receptacle 801 comprises a bottom edge 803, two outwardly curved semi-circular sides 802a and 802b, and two retaining tips 804a and 804b. The edges of twist-in receptacle 801 are adapted to fit between the flanges 601 and 602 of the twist-in connector 600. The body of twist-in connector 600 and twist-in receptacle 801 are substantially semi-circular in shape on their left and right sides such that the twist-in connector 600 may be twisted into its floating position in receptacle. The receptacle tips 804a and 804b of the open end of the twist-in receptacle 801 retain the twist-in connector 600 within the twist-in receptacle 801.

FIG. 8 depicts twist-in connector 600 positioned above twist-in receptacle 801 ready to be inserted. FIG. 9 depicts twist-in connector 600 partially inserted into twist-in receptacle 801. FIG. 10 depicts twist-in connector 600 totally inserted into twist-in receptacle 801 in its floating position locked within twist-in receptacle 801 by receptacle tips 804a and 804b.

In a manner similar to that shown in FIG. 5, connector 600 connects to a corresponding mating connector (similar to 503 of FIG. 5) rigidly attached a motherboard (similar to 500 of FIG. 5). The dimensions of flanges 601 and 602 relative to the main body of twist-in connector 600 of FIG. 6 and twist-in receptacle 801 of FIG. 8, determine the degree of float of twist-in connector 600 within twist-in receptacle 801 similar to the manner described in the first exemplary embodiment. A high degree of float enables better self-alignment characteristics for the mating of the twist-in connector 600 with its mating connector and also enables isolation of the mated connectors from the vibrations of a device (not shown) housed in device frame 800 or other neighboring devices.

Flexible wiring circuit 100 (not shown) provides a spring bias tension to help retain twist-in connector 600 within the lower portion of receptacle 801 as depicted in FIG. 10.

It is expressly understood that the claimed invention is not to be limited to the description of the preferred embodiment but encompasses other modifications and alterations within the scope and spirit of the inventive concept.

We claim:

1. Apparatus for enabling the electronic connection between devices semi-rigidly mounted with respect to one another, said apparatus comprising:
   a connector;
   a device for floatably mounting said connector;
   a wall in said device;
   an opening in said wall adapted to receive said connector;
   means for enabling the insertion of said connector into said opening;

flange means attached to said connector adapted to restrict motion of said connector perpendicular to the plane of said opening in said wall when said connector is inserted in said opening and further adapted to permit said connector to float within the plane of said opening in said wall;

retaining means for retaining said connector within said opening after the insertion of said connector into said opening while enabling said connector to move within the confines defined by said opening; and flexible wiring means electrically connected to said device and to said connector and positioned to provide a spring bias force to position said connector within said opening at a preferred position for mating with other connectors.

2. The apparatus of claim 1 further comprising:

a body of said connector having a substantially rectangular cross-sectional shape in a plane parallel to a front side of said body;

a front flange positioned on said body of said connector near said front side of said body and having dimensions larger than each corresponding dimension of said cross-sectional shape of said body of said connector;

a rear flange positioned on said body of said connector rearward from said front flange and having dimensions larger then each corresponding dimension of said cross-sectional shape of said body of said connector;

a bottom edge of said opening, said bottom edge being longer than a corresponding dimension of said cross-sectional shape of said body of said connector and shorter than a corresponding dimension of said front and rear flanges;

two side edges of said opening extending perpendicularly out from said bottom edge, said two side edges and said bottom edge defining a plane of said opening; and said side edges and said bottom edge having a material thickness in said wall less than the distance between said front flange and said rear flange on said body so as to slide between said front flange and said rear flange of said body when said connector is inserted into said opening.

3. The apparatus of claim 2 wherein said means for retaining further comprises:

tapered ridge means at a top end of each of said side edges, said tapered ridges having a bottom thickness so as to prevent exit of said connector from said opening by blocking the exit of said front and rear flanges from said opening after said connector is inserted into said opening, wherein said tapered ridges are operative to deflect said front and rear flanges of said body to spread apart said front and rear flanges as said connector is inserted into said opening.

4. The apparatus of claim 1 further comprising:

a body of said connector having a substantially elliptical cross-sectional shape in a plane parallel to a front side of said body;

a front flange positioned on said body of said connector near said front side of said body and having dimensions larger than each corresponding dimension of said cross-sectional shape of said body of said connector;

a rear flange positioned on said body of said connector rearward from said front flange and having dimensions larger than each corresponding dimension of said cross-sectional shape of said body of said connector;

a bottom edge and two outwardly inclined semi-circular side edges defining said opening, said edges defining said opening to have dimensions larger than corresponding dimensions of said cross-sectional shape of said body but smaller than corresponding dimensions of said front and rear flanges, wherein said semi-circular side edges and said bottom edge are formed of material in said wall having a thickness less than the distance between said front flange and said rear flange on said body so as to slide between said front and rear flanges of said body of said connector; and wherein the distance between the top extremities of said side edges is larger than the width of said body of said connector so that said connector is inserted into said opening by diagonally inserting one end of said body into one end of said elliptical opening while said flanges straddle said side edges and then rotating said body of said connector so that the other end of said body may be manually pushed past the top extremity of the opposing side of said elliptical opening while said flanges straddle said material comprising said bottom and side edges.

5. Apparatus for enabling the electronic connection between a device housed in a device frame and a motherboard with said device frame being semi-rigidly mounted to said motherboard, said apparatus comprising:

a first connector rigidly attached to said motherboard;

a second connector adapted to mate to said first connector;

an opening formed in a wall of said device frame for movably receiving said second connector;

means for inserting said second connector in said opening;

means for enabling said second connector to float within said opening following said insertion into said opening;

flexible wiring electrically attached to terminals of said second connector and physically attached to said device frame; and means for retaining said second connector within said opening.

6. The apparatus of claim 5 further comprising:

a connector body of said second connector having a substantially rectangular cross-sectional shape;

a front side of said connector body adapted to mate with said first connector means;

a back side of said connector body attached to said flexible wiring;

a front flange attached to said connector body in a plane substantially parallel to said front side of said connector body, wherein said front flange has a substantially rectangular cross-sectional shape with dimensions larger than corresponding cross-sectional dimensions of said connector body;

a rear flange parallel to and spaced apart from said front flange and attached to said connector body in a plane substantially parallel to said back side of said connector body, wherein said rear flange is positioned closer to said back side of said connector body than is said front flange, and wherein said rear flange has a substantially rectangular cross-sectional shape with dimensions larger than corresponding cross-sectional dimensions of said connector body;

a bottom edge of said opening that is wider than the width of said connector body and narrower than the width of said front and rear flanges;

two parallel side edges of said opening, said side edges and said bottom edge forming a plane of said opening, said side edges having a height greater than the height of said front and rear flanges; and said side edges and said bottom edge having a front to rear thickness so as to fit between said front flange and said rear flange of said second connector.

7. The apparatus of claim 6 further comprising:

tapered ridge means at a top end of each of said side edges of said opening, wherein said ridges have a bottom thickness that prevents exit of said second connector from said opening by blocking the passage of said front and rear flanges after said connector is inserted into said opening, wherein:

said ridges are tapered so as to allow said flanges of said second connector to spread apart as said second connector is inserted into said opening.

8. The apparatus of claim 5 wherein said retention means further comprises:

a connector body of said second connector means having a substantially elliptical cross-sectional shape;

a front side of said connector body adapted to mate with said first connector means;

a back side of said connector body attached to said flexible wiring;

a front flange attached to said connector body in a plane substantially parallel to said front side of said connector body, wherein said front flange has a substantially elliptical cross-sectional shape with dimensions larger than corresponding cross-sectional dimensions of said connector body;

a rear flange attached to said connector body in a plane substantially parallel to said back side of said connector body, wherein said rear flange is positioned closer to said back side of said connector body than is said front flange, and wherein said rear flange has a substantially elliptical cross-sectional shape with dimensions larger than corresponding cross-sectional dimensions of said connector body;

a bottom edge of said opening; and two semi-circular side edges attached to said bottom edge, said semicircular side edges and said bottom edge defining said opening to be larger in all corresponding dimensions than said connector body but smaller in all corresponding dimensions than said front and rear flanges, wherein said semi-circular side edges and said bottom edge have a thickness less than the distance between said front flange and said rear flange on said connector body so as to slide between said front flange and said rear flange of said second connector; and wherein the distance between the top extremities of said semi-circular side edges is larger than the width of said connector body of said connector so that said connector is inserted into said opening by diagonally inserting one end of said connector body into one end of said elliptical opening while said flanges straddle said semi-circular sides and then rotating said connector body of said connector so that the other end of said connector body may be manually pushed past the top extremity of the opposing side of said elliptical opening while said flanges straddle said material comprising said bottom and semi-circular side edges.

9. The apparatus of claim 5 wherein said retention means further comprises:

an open top portion of said opening;

a bottom edge of said opening; and a pair of side edges of said opening, wherein said side edges and said bottom and side edges defines a plane of said opening, and wherein said flexible wiring is positioned such that it provides a spring bias force on said connector toward said bottom edge of said opening.

10. A method for enabling a floating electronic connection between devices semi-rigidly mounted with respect to one another, said method comprising the steps of:

forming flanges on a connector;

forming an opening in a wall of a device;

inserting said connector into said opening such that said flanges restrict the motion of said connector perpendicular to the plane of said opening in said wall of said device;

retaining said connector within said opening such that said connector may freely float within the plane of said opening in said wall of said device;

positioning tapered ridges at the edges of said opening in said wall of said device; and sliding said connector over said ridges such that said ridges flex apart said flanges on said connector, until said flanges slide past said ridges allowing said flanges to snap back to normal unflexed position.

11. A method for enabling a floating electronic connection between devices semi-rigidly mounted with respect to one another, said method comprising the steps of:

forming flanges on a connector;

forming an opening in a wall of a device;

inserting said connector into said opening such that said flanges restrict the motion of said connector perpendicular to the plane of said opening in said wall of said device; and retaining said connector within said opening such that said connector may freely float within the plane of said opening in said wall of said device;

positioning semi-circular sides in said opening in said wall of said device;

inserting a first side of said connector into one of said semi-circular sides of said opening in said wall of said device; and twisting said connector such that the other side of said connector snaps into the other of said semi-circular sides of said opening in said wall of said device.

* * * * *